(12) United States Patent
Crawford et al.

(10) Patent No.: US 8,372,666 B2
(45) Date of Patent: Feb. 12, 2013

(54) MISALIGNMENT CORRECTION FOR EMBEDDED MICROELECTRONIC DIE APPLICATIONS

(75) Inventors: Grant A. Crawford, Chandler, AZ (US); Islam Salama, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 12/830,875

(22) Filed: Jul. 6, 2010

(65) Prior Publication Data

US 2012/0009738 A1 Jan. 12, 2012

(51) Int. Cl.
*G01R 31/26* (2006.01)
*H01L 21/66* (2006.01)

(52) U.S. Cl. ........................................... 438/15
(58) Field of Classification Search ............... 438/14, 438/15
See application file for complete search history.

(56) References Cited

U.S. PATENT DOCUMENTS

| | | | |
|---|---|---|---|
| 5,353,498 A | 10/1994 | Fillion et al. | |
| 5,497,033 A | 3/1996 | Fillion et al. | |
| 5,527,741 A | 6/1996 | Cole et al. | |
| 5,739,050 A * | 4/1998 | Farnworth | 438/15 |
| 5,841,193 A | 11/1998 | Eichelberger | |
| 6,154,366 A * | 11/2000 | Ma et al. | 361/704 |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,489,185 B1 | 12/2002 | Towle et al. | |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,703,400 B2 | 3/2004 | Johnson et al. | |
| 6,706,553 B2 | 3/2004 | Towle et al. | |
| 6,709,898 B1 | 3/2004 | Ma et al. | |
| 6,713,859 B1 | 3/2004 | Ma | |
| 6,734,534 B1 | 5/2004 | Vu et al. | |
| 6,794,223 B2 | 9/2004 | Ma et al. | |
| 6,818,544 B2 | 11/2004 | Eichelberger et al. | |
| 6,825,063 B2 | 11/2004 | Vu et al. | |
| 6,841,413 B2 | 1/2005 | Liu et al. | |

(Continued)

OTHER PUBLICATIONS

U.S. Appl. No. 11/860,922, filed Sep. 25, 2007, 19 pages.

(Continued)

*Primary Examiner* — Jenny L Wagner
(74) *Attorney, Agent, or Firm* — Winkle, PLLC (57) ABSTRACT

The present disclosure relates to the field of integrated circuit packaging and, more particularly, to packages using embedded microelectronic die applications, such a bumpless build-up layer (BBUL) designs. Embodiments of the present description relate to the field of alignment correction of microelectronic dice within the bumpless build-up layer packages. This alignment correction may comprise characterizing the misalignment of each microelectronic die mounted on a carrier and forwarding this characterization, along with data regarding the orientation of the carrier, to processing equipment that can compensate for the misalignment of each microelectronic die.

12 Claims, 13 Drawing Sheets

U.S. PATENT DOCUMENTS

| | | | |
|---|---|---|---|
| 6,888,240 B2 | 5/2005 | Towle et al. | |
| 6,894,399 B2 | 5/2005 | Vu et al. | |
| 6,902,950 B2 | 6/2005 | Ma et al. | |
| 6,964,889 B2 | 11/2005 | Ma et al. | |
| 7,067,356 B2 | 6/2006 | Towle et al. | |
| 7,071,024 B2 | 7/2006 | Towle et al. | |
| 7,078,788 B2 | 7/2006 | Vu et al. | |
| 7,109,055 B2 | 9/2006 | McDonald et al. | |
| 7,112,467 B2 | 9/2006 | Eichelberger et al. | |
| 7,160,755 B2 | 1/2007 | Lo et al. | |
| 7,183,658 B2 | 2/2007 | Towle et al. | |
| 7,189,596 B1 | 3/2007 | Mu et al. | |
| 7,416,918 B2 | 8/2008 | Ma | |
| 7,420,273 B2 | 9/2008 | Liu et al. | |
| 7,425,464 B2 | 9/2008 | Fay et al. | |
| 7,442,581 B2 | 10/2008 | Lytle et al. | |
| 7,476,563 B2 | 1/2009 | Mangrum et al. | |
| 7,507,602 B2 * | 3/2009 | Sunohara | 438/108 |
| 7,588,951 B2 | 9/2009 | Mangrum et al. | |
| 7,595,226 B2 | 9/2009 | Lytle et al. | |
| 7,619,901 B2 | 11/2009 | Eichelberger et al. | |
| 7,632,715 B2 | 12/2009 | Hess et al. | |
| 7,648,858 B2 | 1/2010 | Tang et al. | |
| 7,651,889 B2 | 1/2010 | Tang et al. | |
| 7,655,502 B2 | 2/2010 | Mangrum et al. | |
| 7,659,143 B2 | 2/2010 | Tang et al. | |
| 2008/0054448 A1 | 3/2008 | Lu et al. | |
| 2008/0315377 A1 | 12/2008 | Eichelberger et al. | |
| 2008/0315391 A1 | 12/2008 | Kohl et al. | |
| 2009/0072382 A1 | 3/2009 | Guzek | |
| 2009/0079063 A1 | 3/2009 | Chrysler et al. | |
| 2009/0079064 A1 | 3/2009 | Tang et al. | |
| 2009/0212416 A1 | 8/2009 | Skeete | |
| 2009/0294942 A1 | 12/2009 | Palmer et al. | |
| 2010/0044855 A1 | 2/2010 | Eichelberger et al. | |
| 2010/0047970 A1 | 2/2010 | Eichelberger et al. | |

OTHER PUBLICATIONS

U.S. Appl. No. 12/590,350, filed Nov. 6, 2009, 20 pages.
U.S. Appl. No. 12/655,321, filed Dec. 29, 2009, 26 pages.
U.S. Appl. No. 12/655,335, filed Dec. 29, 2009, 36 pages.
U.S. Appl. No. 12/761,782, filed Apr. 16, 2010, 36 pages.
U.S. Appl. No. 12/755,183, filed Apr. 6, 2010, 21 pages.
U.S. Appl. No. 12/755,201, filed Apr. 6, 2010, 23 pages.
U.S. Appl. No. 12/725,925, filed Mar. 17, 2010, 34 pages.
U.S. Appl. No. 12/753,637, filed Apr. 2, 2010, 34 pages.
U.S. Appl. No. 09/640,961, filed Aug. 16, 2000, 70 pages.
U.S. Appl. No. 12/778,335, filed May 12, 2010, 43 pages.
U.S. Appl. No. 12/827,323, filed Jun. 30, 2010, 28 pages.
U.S. Appl. No. 12/868,816, filed Aug. 26, 2010, 23 pages.

* cited by examiner

MISALIGNMENT CORRECTION FOR EMBEDDED MICROELECTRONIC DIE APPLICATIONS

BACKGROUND

Embodiments of the present description generally relate to the field of microelectronic device packaging and, more particularly, to bumpless build-up layer (BBUL) packaging. With shrinking microelectronic device sizes, the precise alignment of the microelectronic devices within a BBUL package has become of greater consequence.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of alignment correction of microelectronic dice within embedded microelectronic die applications, such as bumpless build-up layer packages. This alignment correction may comprise characterizing the misalignment of each microelectronic die and forwarding this characterization, along with data regarding the orientation and deformation of the carrier, to processing equipment that can compensate for the misalignment of each microelectronic die.

Figure 1A:
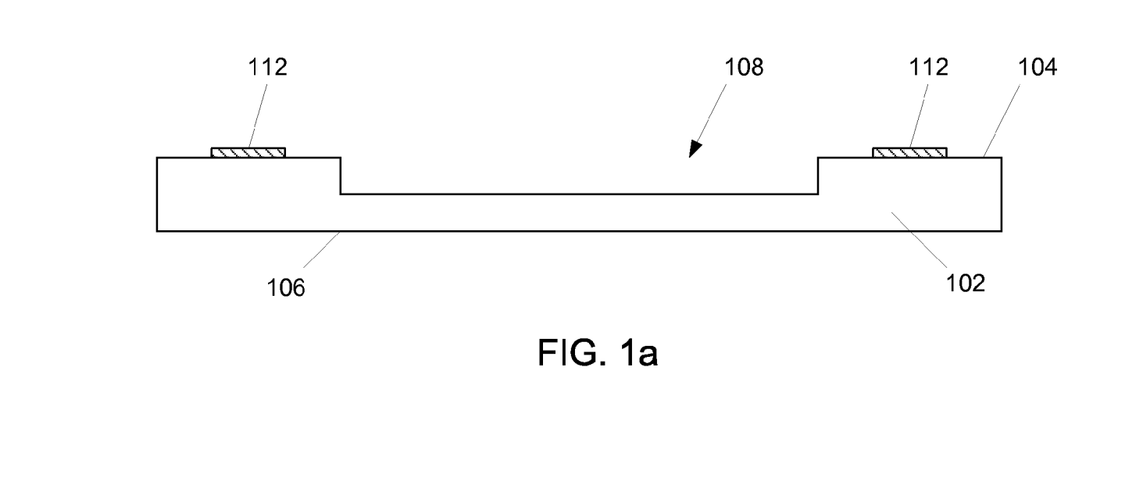
FIGS. 1a-1j illustrate side cross-sectional views of a process of forming a bumpless build-up layer package.

FIGS. 1a-1i illustrate cross-sectional views of an embodiment of a process of forming a bumpless build-up layer—coreless (BBUL-C) package. As shown in FIG. 1a, a carrier 102 having a first surface 104, an opposing second surface 106, and at least one cavity 108 extending from the carrier first surface 104 may be provided. Through build-up contact lands 112 may be patterned on the carrier first surface 104 by any appropriate technique or techniques known in the art.

Figure 1B:
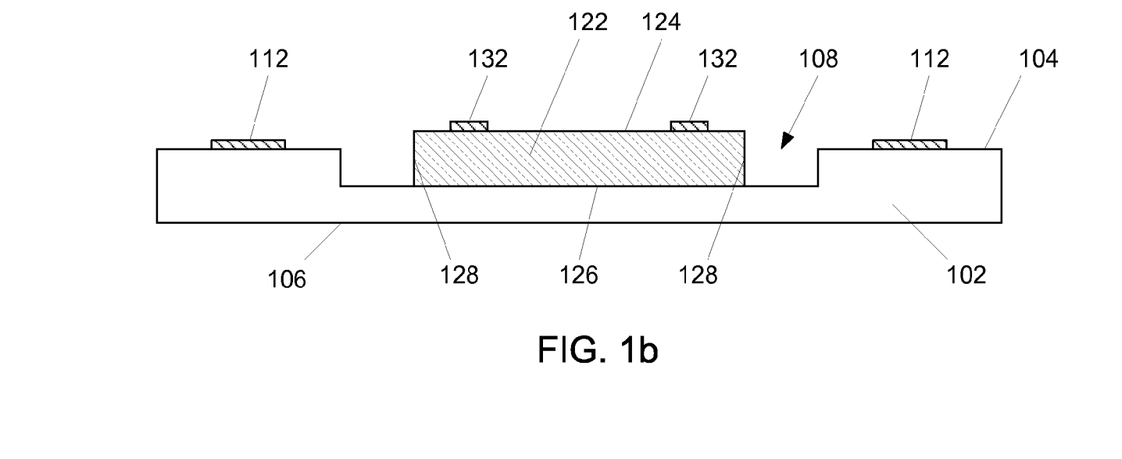

As shown in FIG. 1b, a microelectronic die 122 having an active surface 124, a back surface 126 that is substantially parallel to the microelectronic die active surface 124, and at least one side 128 extending from the microelectronic die active surface 124 to the microelectronic die back surface 126. The microelectronic die back surface 126 may be aligned and attached to the carrier 102 within the carrier cavity 108. The microelectronic die 122 may further include at least one contact land 132 on the microelectronic die active surface 124, wherein the microelectronic die contact lands 132 may be connected to integrated circuits (not shown) within the microelectronic die 122. The microelectronic die 122 may be any appropriate integrated circuit device including but not limited to a microprocessor (single or multi-core), a memory device, a chipset, a graphics device, an application specific integrated circuit, or the like.

Figure 1C:
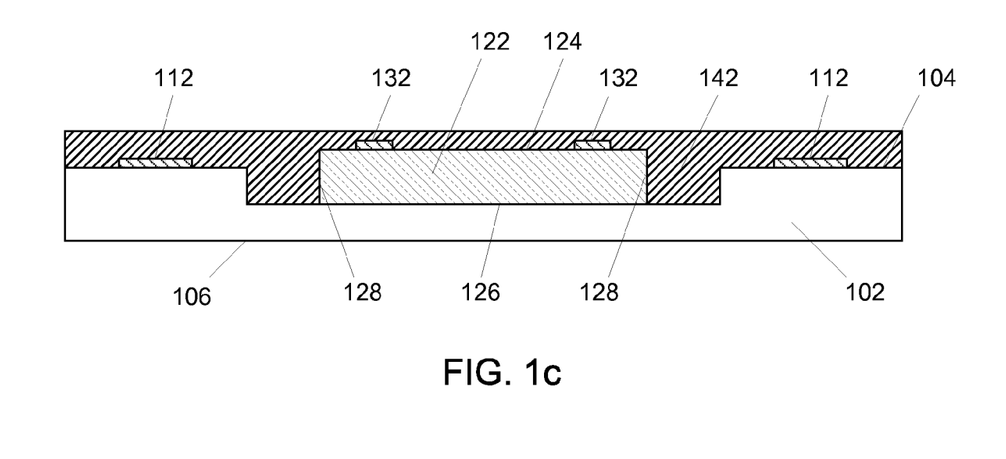

As shown in FIG. 1c, a build-up material 142 may be disposed adjacent the microelectronic die side 128, over the microelectronic die active surface 124 including the microelectronic die contact lands 132, and over the carrier first surface 104 including the through build-up contact lands 112. The build-up material 142 may be disposed by a laminated process, as will be understood to those skilled in the art, and may be any appropriate dielectric material, including, but limited to build-up films, such as are available from Ajinomoto Fine-Techno Co., Inc., 1-2 Suzuki-cho, Kawasaki-ku, Kawasaki-shi, 210-0801, Japan (Ajinomoto GX13, Ajinomoto GX92, and the like).

Figure 1D:
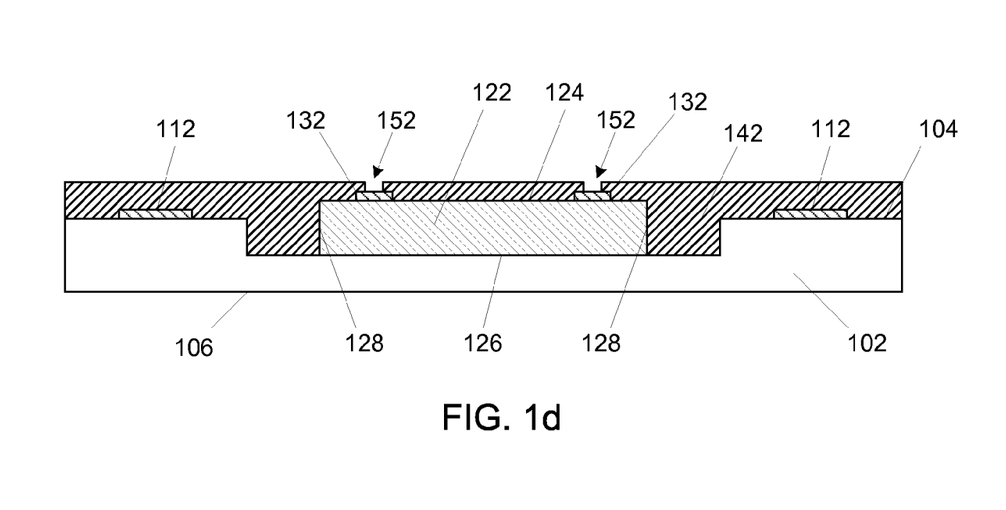

Microelectronic die vias 152 may be formed through the build-up material 142 to expose at least a portion of each microelectronic die contact land 132, as shown in FIG. 1d. The microelectronic die vias 152 may be about 30 um in diameter and may be formed with an ultraviolet laser drill, as will be understood to those skilled in the art.

Figure 1E:
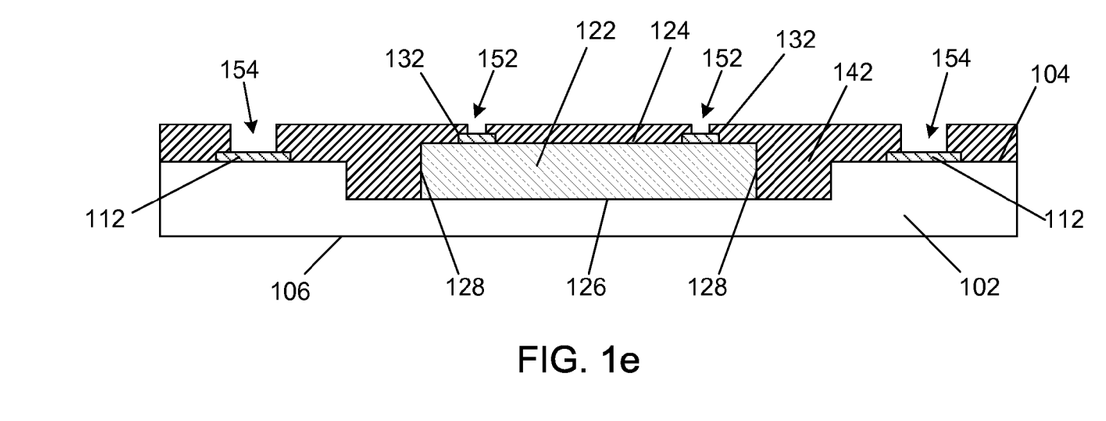

Though build-up vias 154 may be formed through the build-up material 142 to expose at least a portion of each through dielectric build-up land 112, as shown in FIG. 1e. The through build-up vias 154 may be about 150 um in diameter and may be formed with a $CO_2$ (carbon dioxide) laser drill, as will be understood to those skilled in the art.

Figure 1F:
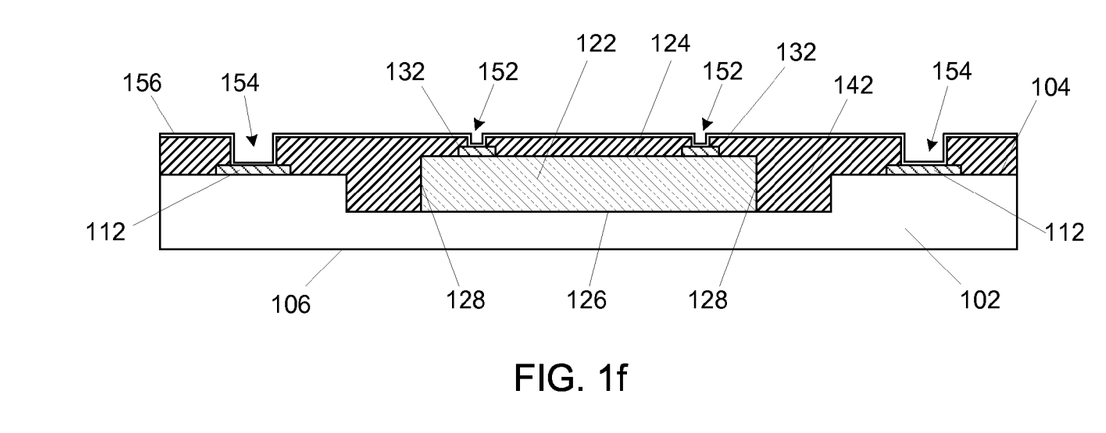
Figure 1G:
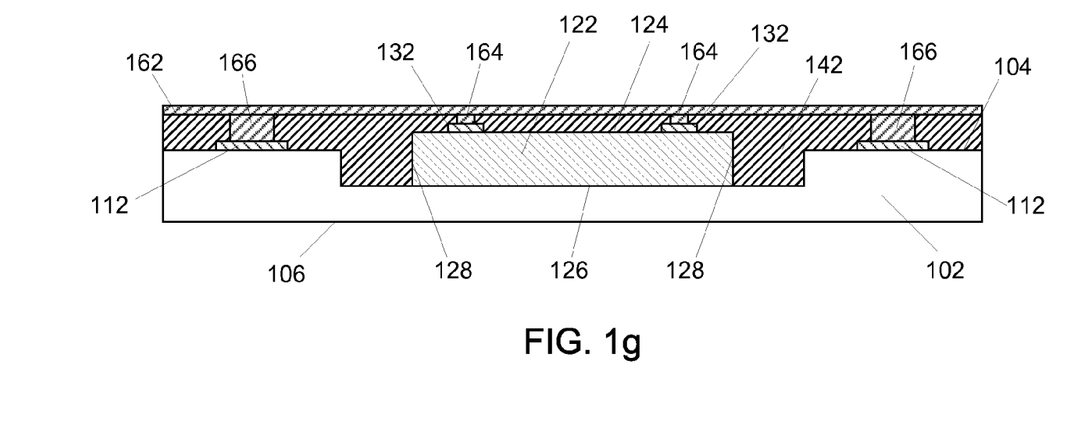
Figure 1H:
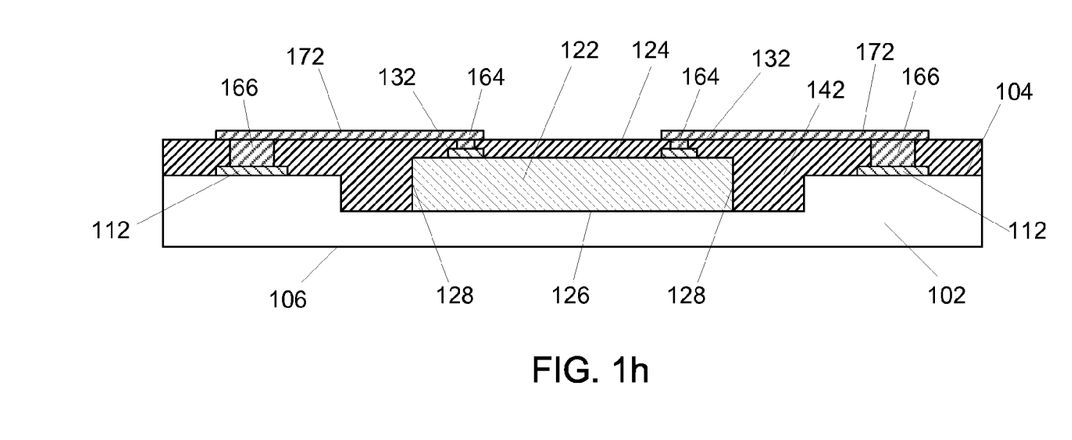

As shown in FIG. 1f, a seed layer 156 may be formed, such as by electroless plating, over the build-up material 142, into the microelectronic die vias 152, and into the through build-up vias 154. The seed layer 156 may then be used to plate a conductive material 162 thereon, such as by electroplating, as shown in FIG. 1g. The plating of the conductive material 162 may fill the microelectronic die vias 152 (see FIG. 1e) to form microelectronic die conductive vias 164 and may fill the through build-up vias 154 (see FIG. 1e) to form through build-up conductive vias 166. The conductive material 162 may be any appropriate conductive material, including but not limited to copper, aluminum, silver, gold, or alloys thereof. The conductive material 162 may then be patterned to form conductive traces 172 on the build-up material 142, such as by a lithographic subtractive/additive process, as will be understood to those skilled in the art, as shown in FIG. h. As will be understood to those skilled in the art, the conductive traces 172 and conductive vias (such as microelectronic die conductive vias 164 and/or through build-up conductive vias 166) in combination are known a first level interconnects.

Figure 1I:
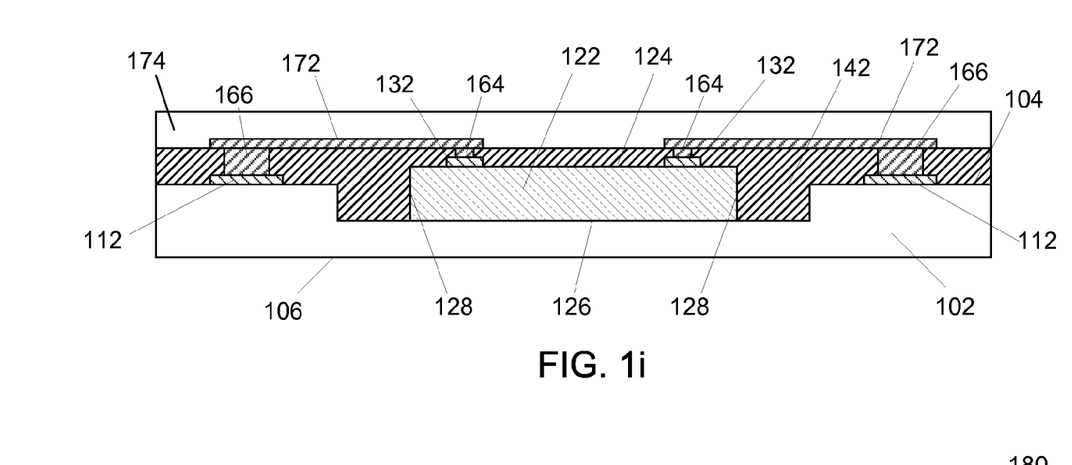

A dielectric material 174 may be disposed, such as by a lamination process, over the conductive traces 172 and the build-up material 142, as shown in FIG. 1i. It is understood that a build-up process, as known in the art, may be followed from FIG. 1i.

Figure 1J:
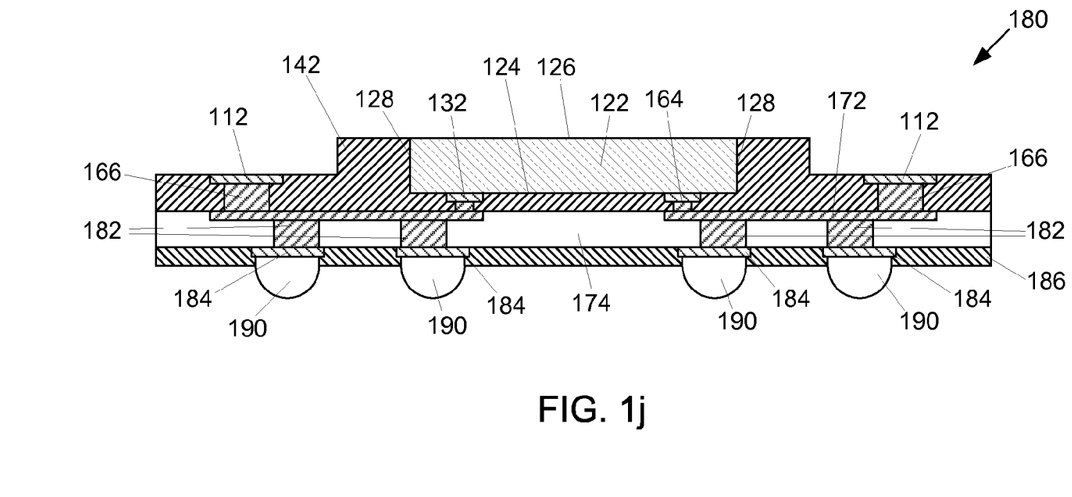

For the sake of brevity, FIG. 1j illustrates a completed microelectronic package 180 after removal from the carrier 102 (see FIG. 1i). The microelectronic package 180 includes conductive vias 182 formed through the dielectric material 174 to connect the conductive traces 172 to external interconnect lands 184 formed on the dielectric material 174. A solder resist material 186 may be disposed and patterned to expose at least a portion of the external interconnect lands 184. External interconnects 190 may be formed on the external interconnect lands 184 through the solder resist material 186. The external interconnects 190 may be solder balls (as shown in FIG. 1i) or pillars (not shown) and may be used to connect the microelectronic package 180 to external devices (not shown).

It is understood that the throughput of the fabrication of the microelectronic package 180 may be doubled by attaching carriers 102 together by their second surfaces 106, as known in the art.

Figure 2:
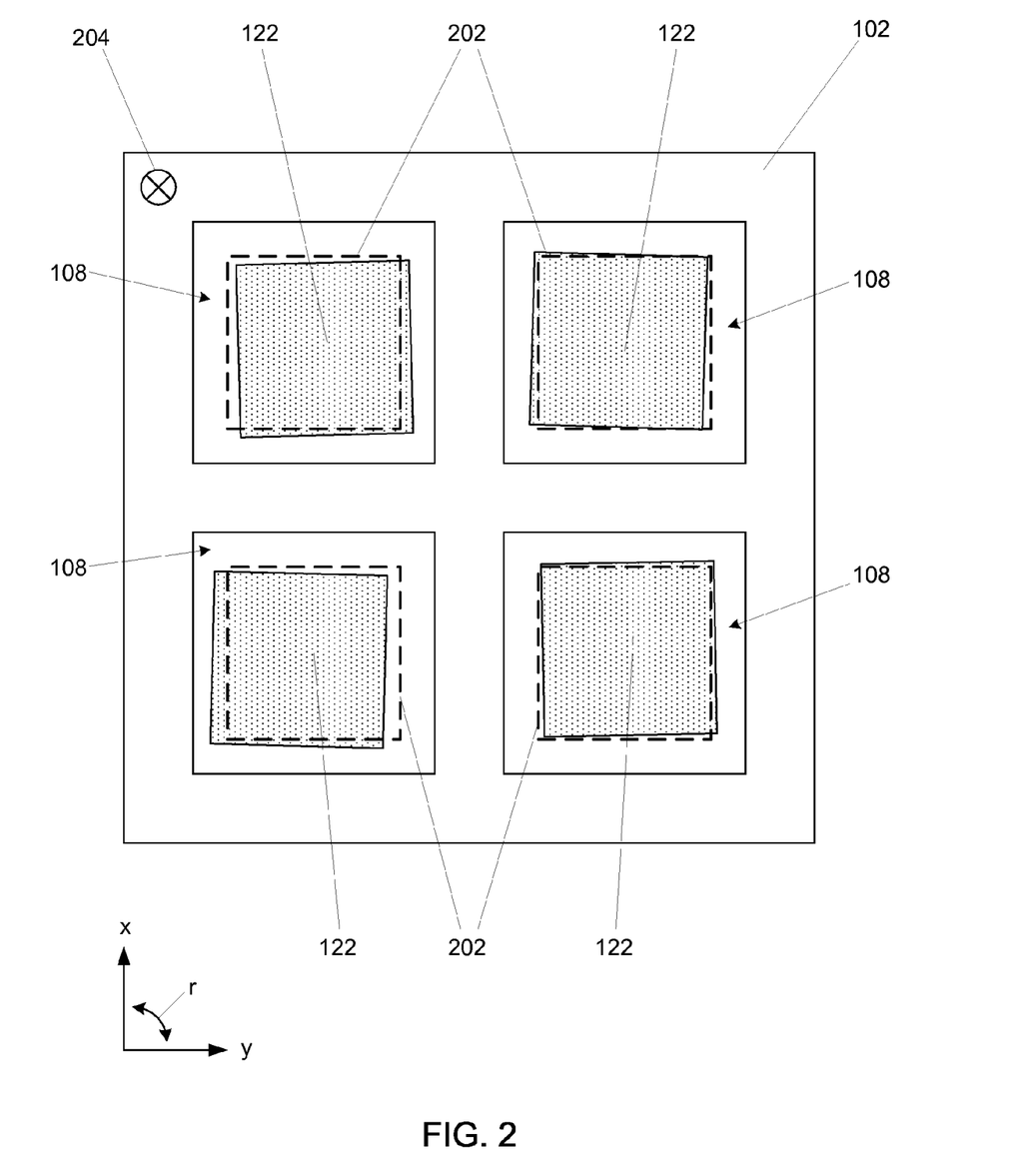
FIG. 2 illustrates a top plan view of four microelectronic dice positioned within cavities of a carrier, showing the potential misalignment of the microelectronic dice.

Referring back to FIG. 1b, the microelectronic die 122 may be positioned within the carrier cavity 108 with known pick-and-place processes. These pick-and-place processes may have inherent associated errors, which may be a factor of the precision of the equipment used. As shown in FIG. 2, such inherent errors may result in random misalignment of each of the microelectronic dice 122 within each carrier cavity 108 compared to a precise alignment position shown by dash lines 202 relative to at least one fiducial 204 on the carrier 102. This random misalignment may result in each microelectronic die 122 having a unique "x" and "y" shift, as well as a unique rotation "r". These inherent associated errors can range from about ±5 um to about ±50 um in any of the x, y, or r directions. As will be understood, this misalignment may result in subsequent substrate manufacturing processes that involve patterning of additional layers having to overcome the misalignment.

As previously discussed, the formation of vias and traces are generally performed with photolithography and laser via drilling. Photolithographic patterning may be performed with contact exposure or projection-type exposure, as will be understood to those skilled in the art. These technologies rely on the use of a photomask to project a desired pattern onto a photoresist material. These photomasks may contain between 100 and 1000 repeated unit designs. For this technology to be effective, the alignment accuracy of the microelectronic dice 122 across the carrier 102 must not change in a non-linear fashion. Thus, it is not possible for standard photolithography patterning to compensate for the misalignment of individual microelectronic dice, such as may be the case in the embedded microelectronic die applications. Likewise, the process flow for laser via drilling is achieved by assuming that each microelectronic die is correctly aligned in a carrier prior to drilling all vias in all microelectronic dice on the carrier. As is the case for photolithography exposure, the laser via drilling process does not take into account the unique and random misalignment of individual microelectronic dice 122.

Although the present description may refer to a single microelectronic die or several microelectronic dice, it is understood that, in the production of microelectronic packages, thousands of microelectronic dice are generally placed and aligned in carriers. The term "carrier", as used within the present description, may include the carrier on which the microelectronic dice are directly mounted, as well as including a combination of a panel and a plurality of carriers and a panel on which the plurality of carriers are positioned and transported through multiple production stages of a fabrication process.

Figure 3:
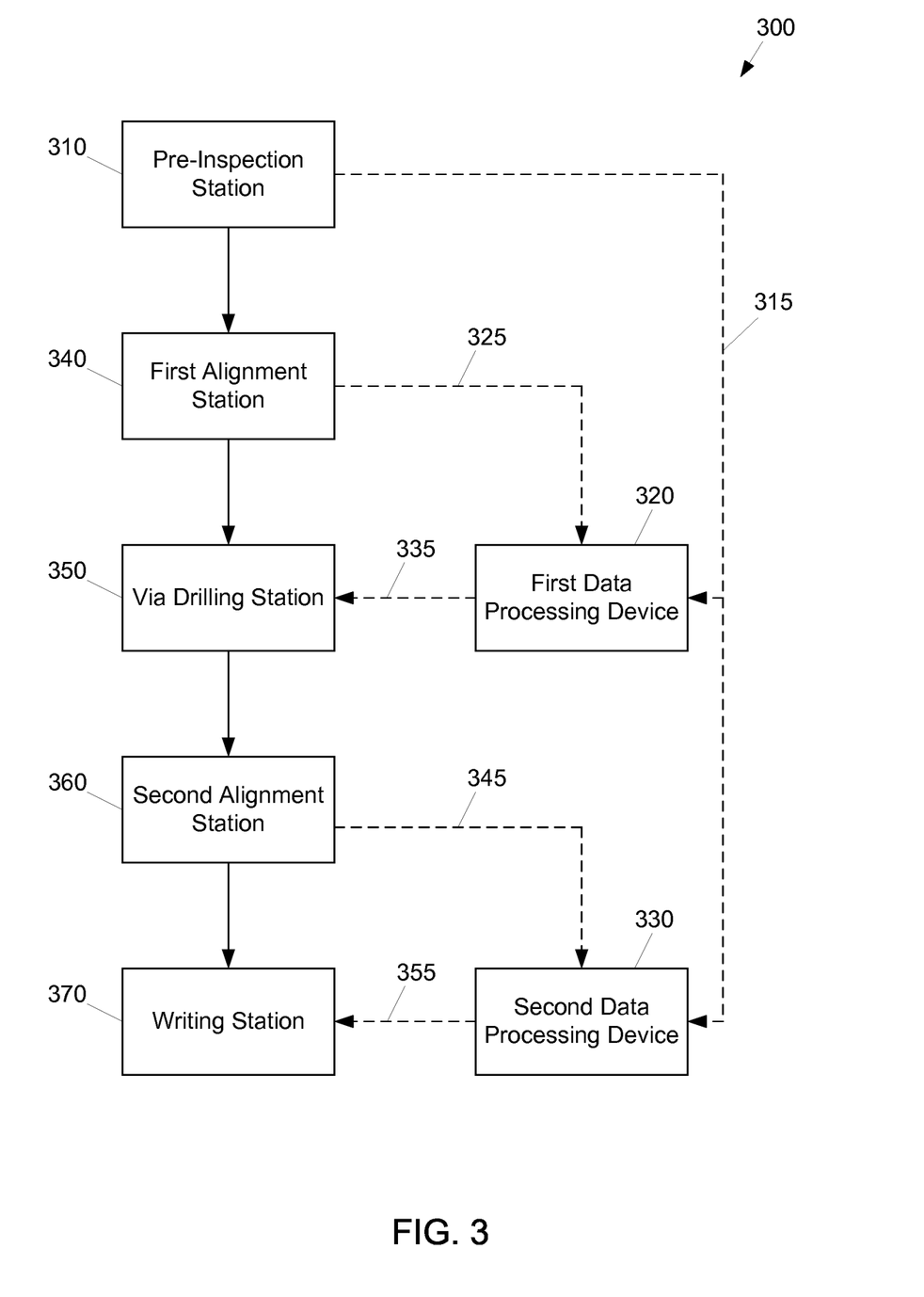
FIG. 3 is a flow diagram of an embodiment of a process for forming a bumpless build-up layer package.

FIG. 3 illustrates a flow diagram of one embodiment of a process 300 to compensate for microelectronic die misalignment. Each microelectronic die within a carrier may be characterized in a Pre-Inspection Station 310 to define its potential misalignment in the x and y directions and/or rotation r (see FIG. 2). The characterization of each microelectronic die may be achieved with at least one camera, such as a charge coupled device (CCD) image sensor, which determines the position of each microelectronic die relative to at least one carrier fiducial, as will be understood to those skilled in the art. The misalignment characterization 315 may be sent to a First Data Processing Device 320 and to a Second Data Processing Device 330, such as computer aided design workstations. The carrier may be sent to a First Alignment Station 340 where the relative position and deformation of the carrier itself may then be determined. The position and deformation of the carrier may be determined with at least one camera, such as a charge coupled device (CCD) image sensor, which determines the position of the carrier relative to at least one carrier fiducial, as will be understood to those skilled in the art. The carrier alignment and deformation first data 325 may be sent to the First Data Processing Device 320.

After the build-up material 142 is disposed on the microelectronic die 122 (see FIG. 1c), the carrier may be sent to a Via Drilling Station 350, where vias are formed with at least one laser drill, such the ultraviolet laser drill and/or the $CO_2$ laser drill as discussed in FIGS. 1d and 1e. The misalignment characterization 315 and the carrier alignment and deformation first data 325 may be processed by the First Data Processing Device 320 which sends position information 335 to the equipment at the Via Drilling Station 350. The position information 335 is used to instruct the laser drill(s) where to drill in order to (referring to FIGS. 1d and 1e) expose the microelectronic die contact lands 132 on each microelectronic die 122 and/or expose the through build-up contact lands 112.

The carrier may be sent to a Second Alignment Station 360 where the relative position and deformation of the carrier itself may again be determined. Again, the position and deformation of the carrier may be determined with at least one camera, such as a charge coupled device (CCD) image sensor, which determines the position and deformation of the carrier relative to at least one carrier fiducial, as will be understood to those skilled in the art. The carrier alignment and deformation second data 345 may be sent to the Second Data Processing Device 330 and the carrier may be sent to a Writing Station 370. It is understood that at least one processing step may occur between the Via Drilling Station 350 and the Second Alignment Station 360.

In one embodiment, the equipment of the Writing Station 370 may include a Laser Direct Imaging (LDI) device. Laser Direct Imaging is a mask-less exposure technology which projects an image with a laser onto the carrier surface using a light modulating device (e.g. spacial light modulator, grating light valve, digital micro-mirror device). The laser may expose a photo-sensitive resist used in the formation of the conductive traces 172 (see FIG. 1i), as will be understood to those skilled in the art. The Second Data Processing Device 330 may send writing instructions 355 to the Writing Station 370 to define the image that the laser "writes" into the photoresist material (thereby altering the photoresist material by the exposure to the laser), so that the misalignment of each microelectronic die may be corrected with subsequently formed conductive traces 172 (see FIG. 1i).

In the embodiment of FIG. 3, wherein the pre-inspection is conducted off-line and the microelectronic die misalignment information is fed forward to data processing devices prior to laser drilling and lithographic exposure, it may be assumed that the relative microelectronic die misalignment will remain constant from pre-inspection through laser drilling and lithographic exposure. This assumption should be valid as the relative die misalignment should remain constant or be consistent in a manner that one could characterize the process to predict the position change for each microelectronic die.

Figure 4:
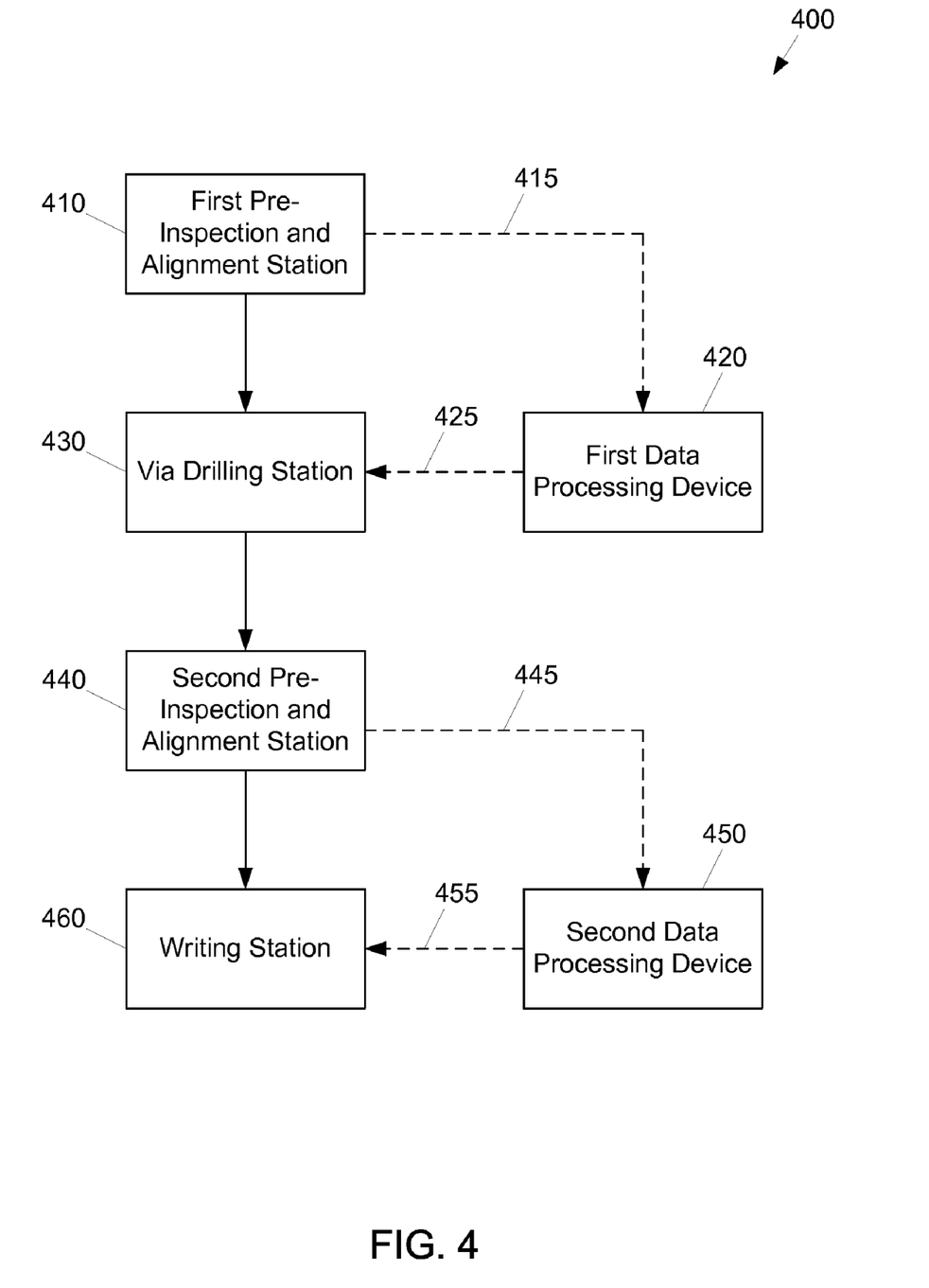
FIG. 4 is a flow diagram of another embodiment of a process for forming a bumpless build-up layer package.

FIG. 4 illustrates a flow diagram of another embodiment of a process 400 to compensate for microelectronic die misalignment where pre-inspection alignment is conducted in-line just prior to drilling of the vias and again just before the formation of the conductive traces. This process flow may be less susceptible to carrier deformation and microelectronic die shift between processing steps than with the embodiment illustrated in FIG. 3.

As shown in FIG. 4, a carrier may be sent to a First Pre-Inspection and Alignment Station 410 where each microelectronic die within the carrier may be characterized to defined its potential misalignment in the x and y directions and/or rotation r (see FIG. 2) and where the position and deformation of the carrier may be determined relative to carrier fiducials, as will be understood to those skilled in the art. The characterization of each microelectronic die and the position/deformation of the carrier may be determined with at least one camera, such as a charge coupled device (CCD) image sensor. The misalignment characterization/carrier alignment first data 415 may be sent to a First Data Processing Device 420.

After the build-up material 142 is disposed on the microelectronic die 122 (see FIG. 1c), the carrier may be sent to a Via Drilling Station 430, wherein vias are formed with a laser drill, such the ultraviolet laser drill and/or the $CO_2$ laser drill as discussed in FIGS. 1d and 1e. The misalignment characterization/carrier alignment and deformation first data 415 is processed by the First Data Processing Device 420 which sends position information 425 to the equipment at the Via Drilling station 430. The position information 425 is used to instruct the laser drill(s) where to drill in order to (referring to FIGS. 1d and 1e) expose the microelectronic die contact lands 132 on each microelectronic die 122 and/or to expose the through build-up contact lands 112.

The carrier may be sent to a Second Pre-Inspection and Alignment Station 440 where each microelectronic die on the carrier may again be characterized, such as through the location of the microelectronic die vias 152, to define its potential misalignment in the x and y directions and/or rotation r (see FIG. 2) and where the position and deformation of the carrier may again be determined relative to at least one carrier fiducial, as will be understood to those skilled in the art. The characterization of each microelectronic die and the position of the carrier may be determined with at least one camera, such as a charge coupled device (CCD) image sensor. The misalignment characterization/carrier alignment and deformation second data 445 may be sent to a Second Data Processing Device 450. In this embodiment, pre-inspection and carrier alignment is conducted simultaneously. Thus, the embodiment is less susceptible to misalignment error from carrier deformation and microelectronic die shift between processing steps, than the embodiment shown in FIG. 3. The Second Data Processing Device 450 may send writing instructions 455 to the Writing Station 460 to define the image that the laser "writes" into the photoresist material (thereby altering the photoresist material by the exposure to the laser), so that the misalignment of each microelectronic die may be corrected with subsequently formed conductive traces 172 (see FIG. 1i). It is understood that at least one processing step may occur between the Via Drilling Station 430 and the Second Pre-Inspection and Alignment Station 440.

The throughput of the embodiments of FIGS. 3 and 4 may be improved with a parallel writing and alignment capability, as known in the art, where the carriers are fixed to a movable stage/table using vacuum suction. The relative position of the carriers/table as well as the carrier fiducials are determined in the Second Alignment Station 360 of FIG. 3 or the Second Pre-Inspection and Alignment State 440 of FIG. 4. This process takes place while a different carrier is being processed in the Writing Station 370 of FIG. 3 or the Writing Station 460 of FIG. 4. Once the alignment and writing is finished, the two carriers are passed by one another by lifting one moveable table over the other. The new carrier to be written is moved beneath the writing engine and the table position is quickly determined using the writing laser in order to maintain the alignment position.

Figure 5:
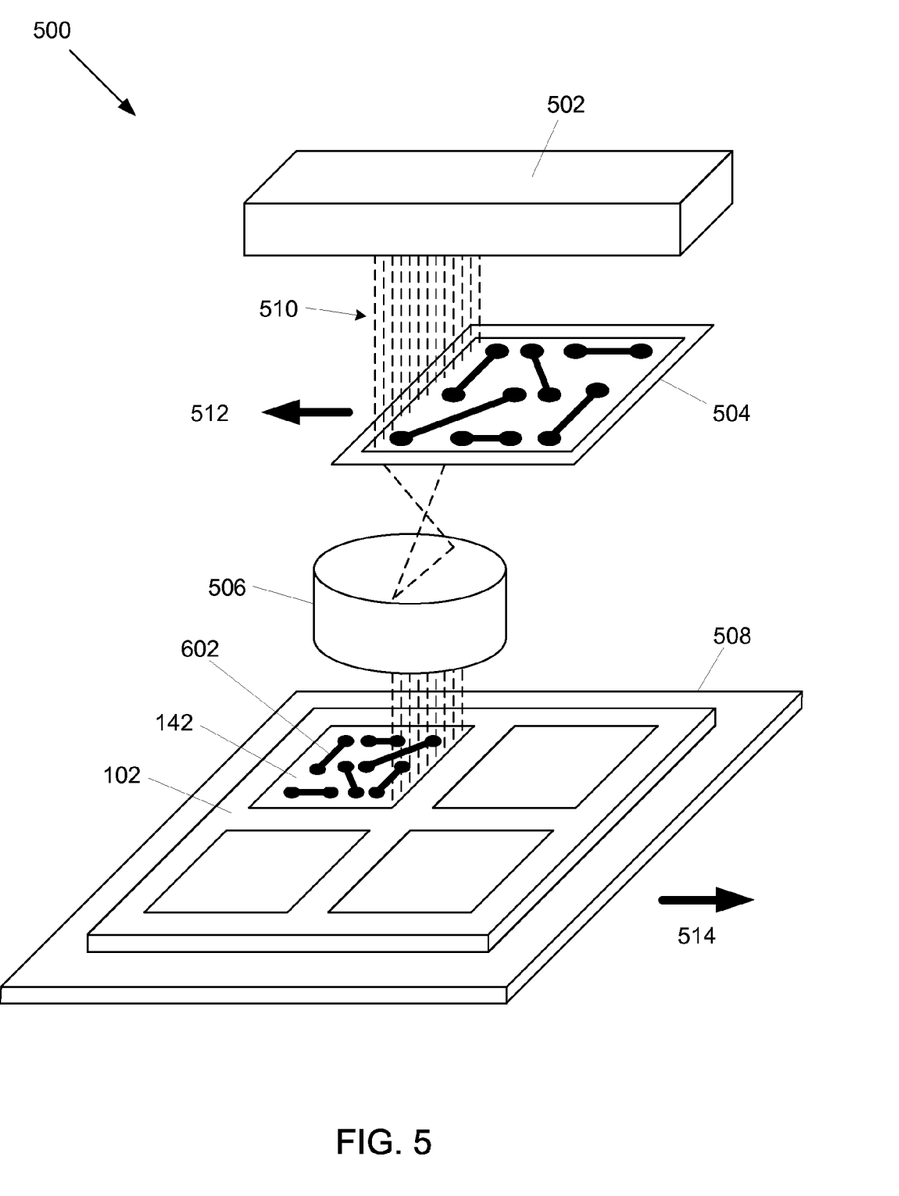
FIG. 5 illustrates an oblique view of a Laser Projection Patterning device.
Figure 6A:
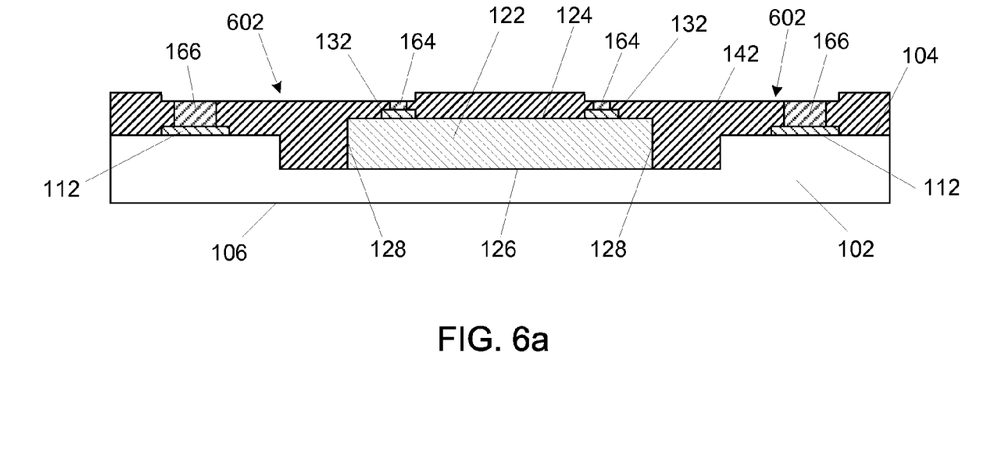
FIGS. 6a and 6b illustrate the formation of a conductive trace with the Laser Projection Patterning device of FIG. 5.
Figure 6B:
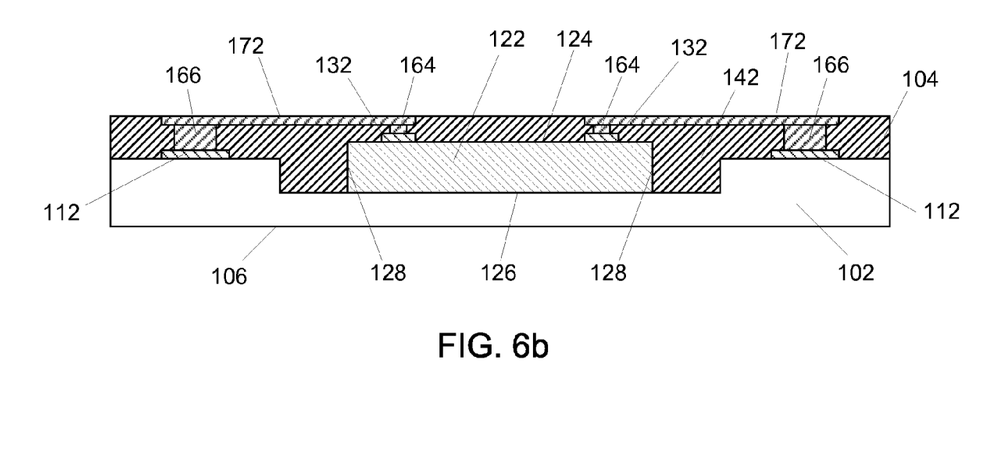

In another embodiment of the present invention, the Writing Station 370 of FIG. 3 and Writing Station 460 of FIG. 4 may include a Laser Projection Patterning (LPP) device. FIG. 5 illustrates the basic components of the Laser Projection Patterning device 500, as known in the art, including a high energy excimer laser 502, a movable glass mask 504, a projection lens 506, and an x-y carrier stage 508. By using a high energy excimer laser 502, the Laser Projection Patterning device 500 can be used to pattern the build-up material 142 by ablation for the formation of the conductive traces 172. As shown in FIG. 6a, a conductive trace route 602 may be ablated into the build-up material 142. Thus, the semi-additive process of FIGS. 1d-1h may be replaced with the plating of conductive material (electroless plating followed by electroplating) and a chemical mechanical polishing thereof, which result in the conductive traces 172 formed within the build-up material 142, as shown in FIG. 6b, rather than on the build-up material 142, as shown in FIG. 1i.

With the Laser Projection Patterning device 500, the conductive trace route 602 ablated into the build-up material 142 is determined by the movable glass mask 504. The movable glass mask 504 as well as an incident laser beam (or line) 510 fired from the high energy excimer laser 502 are moved relative (shown as arrows 512 and 514) to one another in order to scan the entire pattern onto the build-up material 142 (as a part of the previously described structures which are mounted on x-y carrier stage 508). This process may be done on a unit-by-unit or microelectronic die-by-microelectronic die basis. Therefore, the Laser Projection Patterning device 500 itself or the movable glass mask 504 can be shifted in the x direction and/or y direction, and/or rotated in the r direction to correct the potential misalignment of the microelectronic die 122 (see FIG. 2).

Figure 7A:
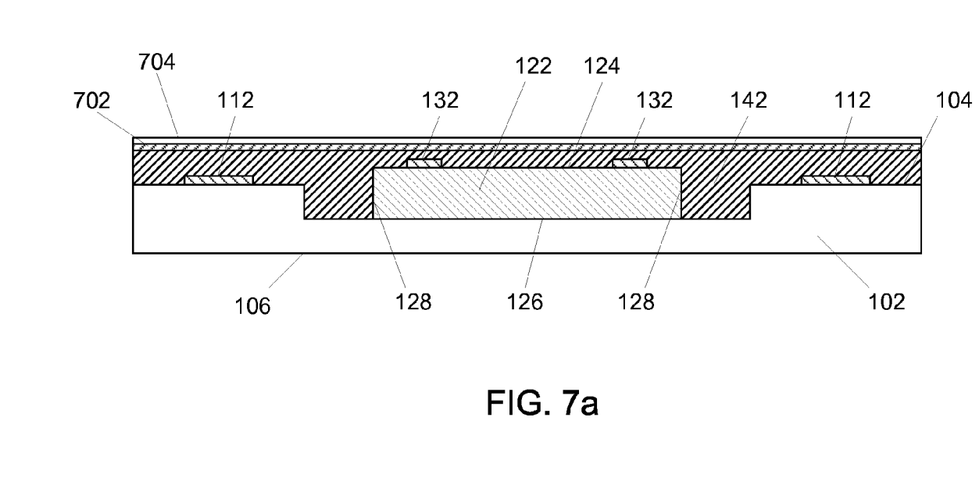
FIGS. 7a-7d illustrate a single step laser drilling process for forming vias.

In an embodiment of the present description, the Via Drilling Station 350 of FIG. 3 or the Via Drilling Station 430 of FIG. 4 may comprise a single step laser drilling process, as illustrated in FIGS. 7*a*-7*d*. Beginning at FIG. 1*b*, the build-up material 142 may be disposed on and adjacent the microelectronic die 122 and on the carrier 102, as previously described, a metal layer 702 (such as a copper layer) may be disposed on the build-up material 142, and a photoresist material 704 may be deposited on the metal layer 702, as shown in FIG. 7*a*. The structure shown in FIG. 7*a* may be formed layer-by-layer, where the build-up material 142 may be laminated by itself, the metal layer 702 formed individually on the build-up material 142, and the photoresist material 704 separately formed on the metal layer 702. The structure shown in FIG. 7*b* may also be formed with pre-laminated layers. The build-up material 142 and metal layer 702 may be provided as a layered sheet, which is laminated on the microelectronic die 122 and on the carrier 102, wherein the photoresist material 704 is separately deposited on the metal layer 702. In another embodiment, the build-up material 142, the metal layer 702, and the photoresist material 704 may be provided as a layered sheet, which is laminated on the microelectronic die 122 and the carrier 102.

Figure 7B:
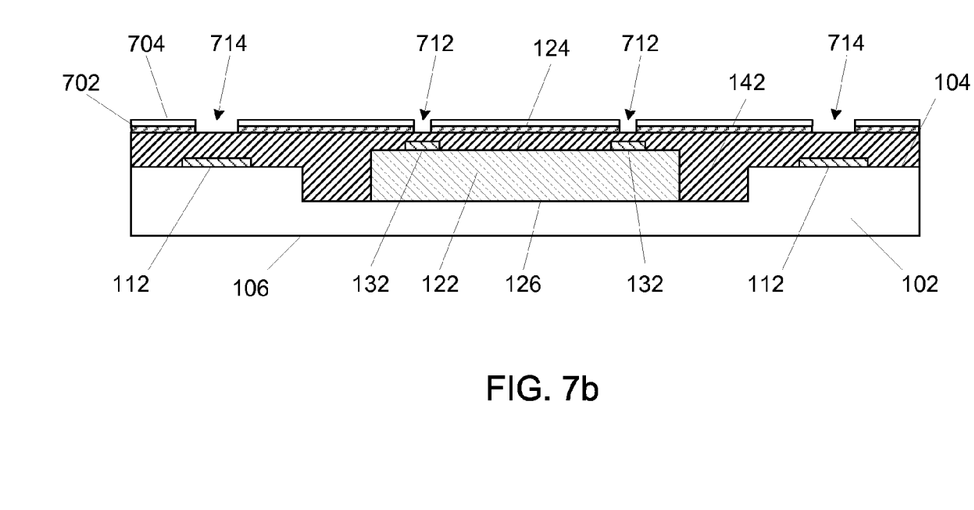

The photoresist material 704 may be patterned to form an opening to expose a portion of the metal layer 702 and the exposed metal layer 702 may be etched to form first openings 712 over the microelectronic die contact lands 132 and to form second openings 714 over the through build-up contact lands 112, as shown in FIG. 7*b*. The patterning of the photoresist material 704 is directed by the First Data Processing Device 320 of FIG. 3 or the First Data Processing Device 420 of FIG. 4, as previously discussed.

Figure 7C:
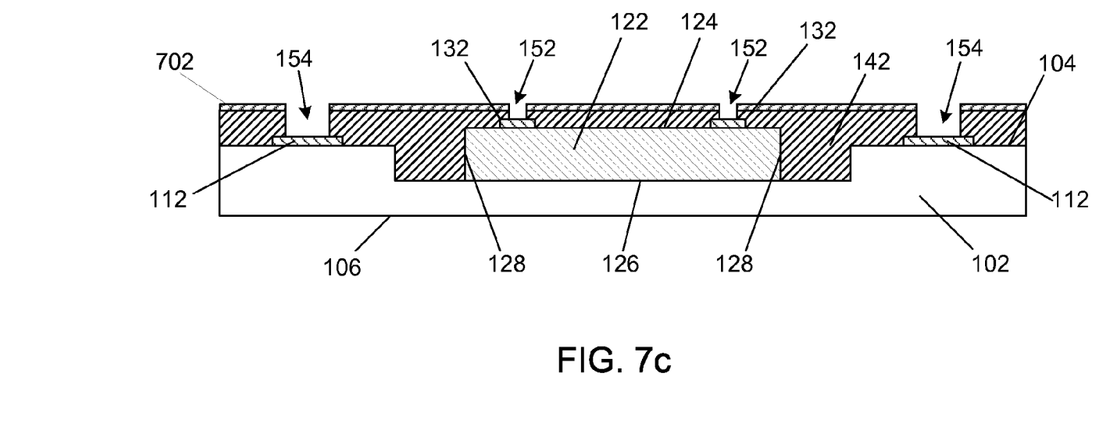
Figure 7D:
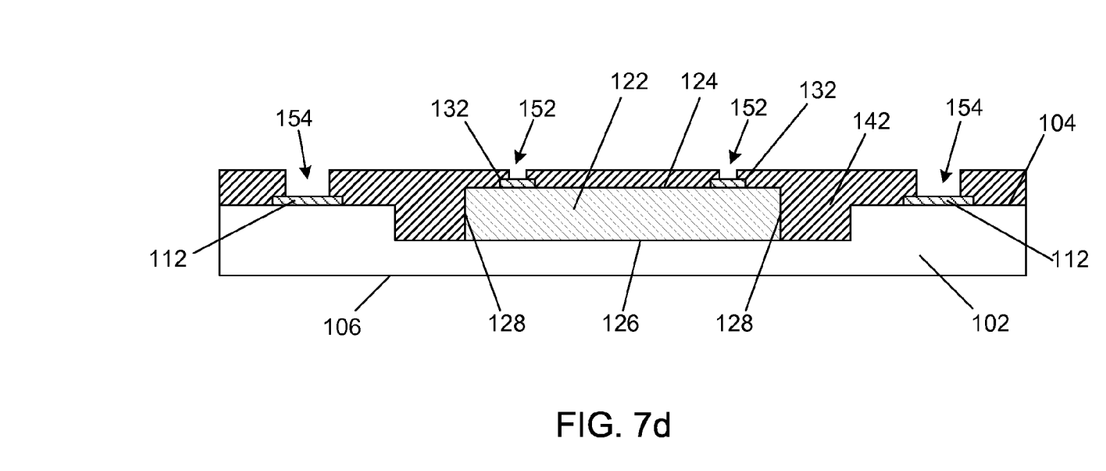

The photoresist material 704 may be removed and the etched metal layer 702 may be used as a mask. A laser beam, such as a $CO_2$ laser, may be flooded over the etched metal layer 702, thereby forming the microelectronic die vias 152 through the build-up material 142 to expose at least portions of the microelectronic die contact lands 132, and also forming the though build-up vias 154 through the build-up material 142 to expose at least a portion of the through dielectric contact lands 112, as shown in FIG. 7*c*. The metal layer 702 may be removed, as shown in FIG. 7*d*, which corresponds to FIG. 1*e*, and the processes previously described continue from there.

Figure 8:
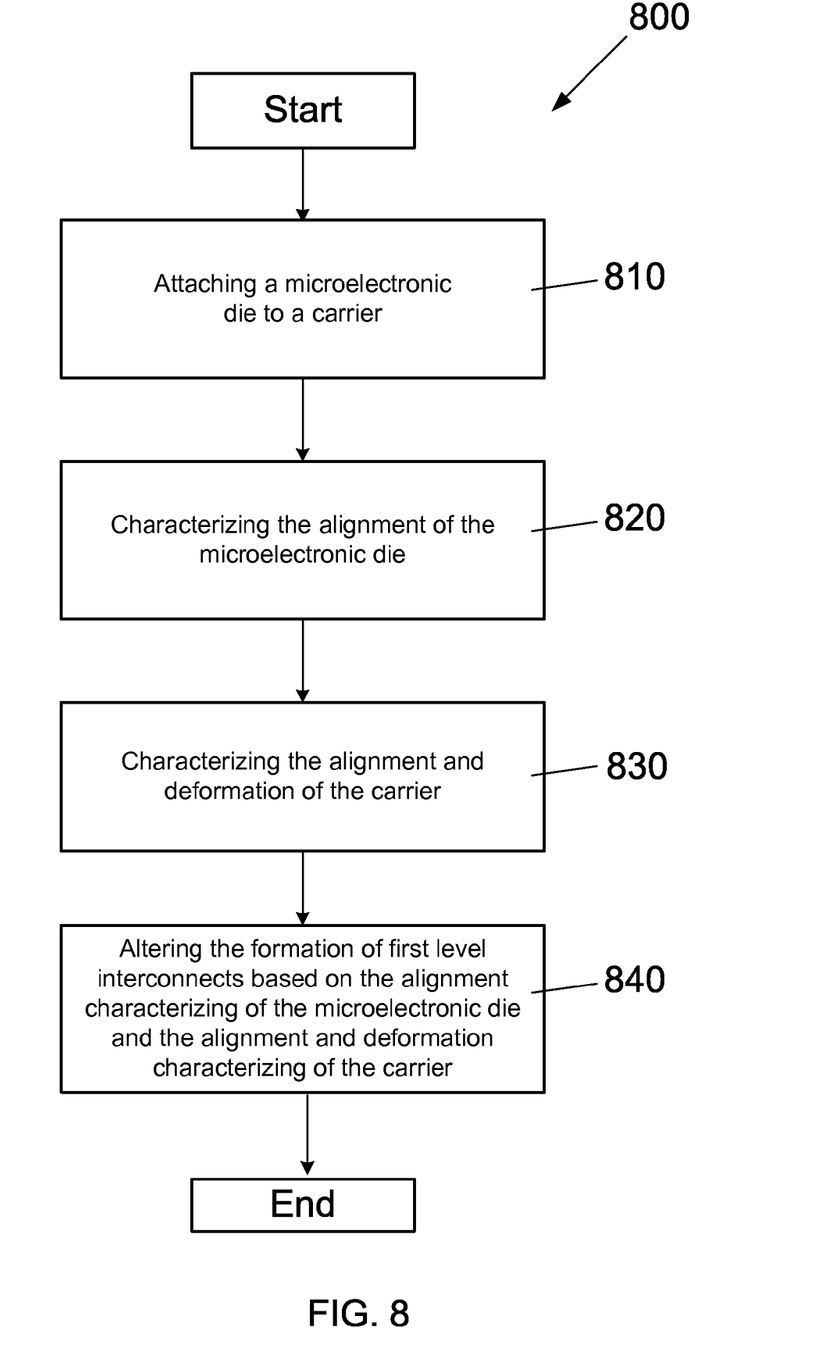
FIG. 8 is a flow diagram of an embodiment of a fundamental process for forming a bumpless build-up layer package.

A fundamental embodiment of a process of the present description is illustrated in the flow diagram 800 of FIG. 8. As defined in block 810, a microelectronic die may be attached to a carrier. The alignment of the microelectronic die may be characterized, as defined in block 820. As defined in block 830, the alignment and deformation of the carrier may also be characterized. The formation of first level interconnects may be altered based on the characterization of the microelectronic die alignment and the characterization of the alignment and deformation of the carrier, as defined in block 840.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A method of forming a microelectronic package, comprising:

attaching a microelectronic die to a carrier;
characterizing the alignment of the microelectronic die;
characterizing the alignment and deformation of the carrier; and
forming first level interconnects on the microelectronic die to compensate for misalignment of the microelectronic die based on the characterizing the alignment of the microelectronic die and on the characterizing the alignment and deformation of the carrier.

2. The method of claim 1, wherein forming the first level interconnects comprises forming at least one via through a build-up material formed on the microelectronic die in at least one location determined by the characterizing the alignment of the microelectronic die and by the characterizing the alignment and deformation of the carrier.

3. The method of claim 2, wherein forming the at least one via comprises laser drilling the at least one via through a build-up material formed on the microelectronic die.

4. The method of claim 2, wherein forming the at least one via comprises forming the at least one via through the build-up material to expose at least a portion of at least one contact land on the microelectronic die.

5. The method of claim 2, wherein forming the at least one via comprises:
  forming a metal layer on the build-up material;
  forming a photoresist material on the build-up material;
  patterning at least one opening within the photoresist material to expose a portion of the metal layer;
  etching the metal layer to form at least one opening to expose a portion of the build-up material over at least one microelectronic die contact land; and
  laser drilling the build-up material through the metal layer opening to expose at least a portion of the at least one microelectronic die contact land.

6. The method of claim 1, wherein forming the first level interconnects comprises forming a conductive trace on and/or in a build-up material formed on the microelectronic die.

7. The method of claim 6, wherein forming the conductive trace comprises exposing a photoresist material formed on the build-up material with a laser.

8. The method of claim 7, wherein forming the conductive trace further includes forming the conductive trace with a semi-additive process.

9. The method of claim 6 wherein forming the conductive trace comprises forming the conductive trace by ablating a conductive trace route in the build-up material with a laser.

10. The method of claim 9, wherein forming the conductive trace further comprises disposing a conductive material within the conductive trace route.

11. The method of claim 1, wherein characterizing the alignment of the microelectronic die comprises characterizing the alignment of the microelectronic die relative to at least one fiducial on the carrier with at least one camera.

12. The method of claim 1, wherein characterizing the alignment and deformation of the carrier comprises characterizing the alignment and deformation of the carrier relative to at least one fiducial on the carrier with at least one camera.

* * * * *